United States Patent [19]
Zhou

[11] Patent Number: 5,828,236
[45] Date of Patent: Oct. 27, 1998

[54] SELECTABLE INVERTER CIRCUIT

[75] Inventor: Shi-dong Zhou, Milpitas, Calif.

[73] Assignee: Xilinx, Inc., San Jose, Calif.

[21] Appl. No.: 801,408

[22] Filed: Feb. 20, 1997

[51] Int. Cl.$^6$ ........................ H03K 19/20; H03K 19/0948
[52] U.S. Cl. .............................. 326/121; 327/408; 327/83
[58] Field of Search ........................... 327/408; 326/121, 326/83, 82, 17

[56] References Cited

U.S. PATENT DOCUMENTS 3,925,685  12/1975  Suzuki ..................................... 326/83
5,233,233   8/1993  Inoue et al. ............................. 327/408

*Primary Examiner*—Jon Santamauro
*Assistant Examiner*—Don Phu Le
*Attorney, Agent, or Firm*—Edel M. Young

[57] ABSTRACT

A selectable inverter circuit. An inverter circuit receives an input signal which is complemented before becoming an output signal. A pass-through circuit for setting the output signal equivalent to the input signal. An enabling circuit for providing power to the inverter circuit, in response to a selection signal. The enabling circuit also provides a charge storing circuit with a supplemental charge. The charge storing circuit releasing the supplemental charge to the inverter circuit, and so provides the inverter circuit with even more power. The enabling circuit activating the pass-through circuit and deactivating the inverter circuit in response to the first state of the selection signal. The enabling circuit deactivating the pass-through circuit and activating the inverter circuit in response to the second state of the selection signal.

15 Claims, 1 Drawing Sheet

5,828,236

SELECTABLE INVERTER CIRCUIT

BACKGROUND OF THE INVENTION

1. Field of the Invention

The present invention relates generally to selectable inverter circuits, and more particularly toward reducing delays within a selectable inverter circuit.

2. Discussion of Background Art

Digital logic circuits include a plurality of sub-circuits which perform various logic functions in support of their operations. One such sub-circuit is a selectable inverter circuit. A selectable inverter circuit receives an input signal and, in response to a selection signal, routes the input signal to a first circuit path which outputs the input signal as is, or to a second circuit path which inverts and outputs the input signal.

Current selectable inverter circuits invert the input signal by incorporating an extra inverter in the inverting circuit path. However, the extra inverter introduces a timing delay which effectively reduces the speed of a circuit utilizing the selectable inverter circuit.

What is needed is an improved selectable inverter circuit that reduces the timing delay in the inverting path.

SUMMARY OF THE INVENTION

According to the present invention, an inverter circuit that receives an input signal, inverts it, and outputs the resulting signal receives power to perform this inversion from an enabling circuit, in response to a selection signal. The enabling circuit also stores charge to be used by the inverter circuit to drive the output signal. Since the enabling circuit has an internal resistance which limits the enabling circuit's ability to transfer power to the inverter circuit, the charge storing circuit releases and absorbs current from the inverter circuit, and so provides the inverter circuit with more speed. The charge storing circuit can include capacitors made from MOS devices or other types of capacitors.

In another aspect of the invention, the pass-through circuit introduces a delay into the non-inverting path and reduces delay in the inverting path. This shifting of delays is caused by adding capacitors for driving the output line. The capacitance is chosen such that the delays of the two paths are as close to being equal as possible.

Circuits containing the selectable inverter circuit described above can operate faster than conventional circuits since the capacitance of the charge storing devices may be selected so as to equalize the delays introduced by the pass-through circuit and the inverter circuit.

These and other aspects of the invention will be recognized by those skilled in the art upon review of the detailed description, drawings, and claims set forth below.

DETAILED DESCRIPTION OF THE PREFERRED EMBODIMENT

Figure 1:
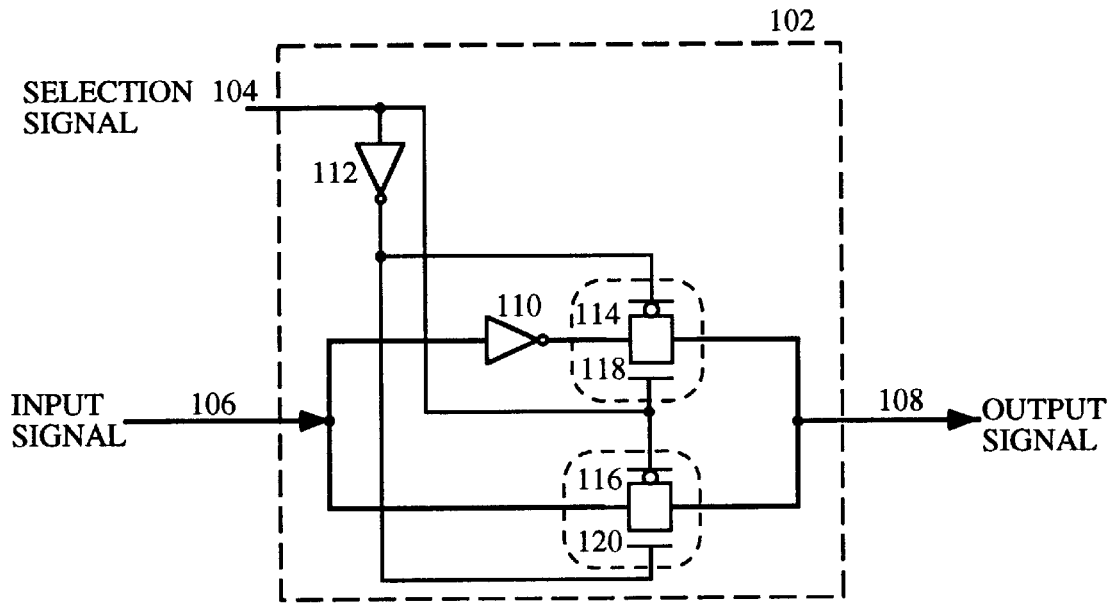
FIG. 1 is a block diagram of a prior art selectable inverter circuit.

FIG. 1 is a block diagram of prior art selectable inverter circuit 102. Prior art circuit 102 receives a selection signal on line 104, an input signal on line 106, and generates an output signal on line 108. Prior art circuit 102 sets the output signal equal to the input signal if the selection signal is low. Prior art circuit 102 outputs a complement of the input signal if the selection signal is high.

Prior art circuit 102 includes two inverters 110 and 112, two NMOS transistors 118 and 120, and two PMOS transistors 114 and 116. Line 104 is coupled to the gates of transistors 116 and 118 and through inverter 112 to the gates of transistors 114 and 120. Line 106 is coupled to inverter 110 and to the input of transistors 116 and 120. Inverter 110 outputs a signal to the inputs of transistors 114 and 118. The outputs of transistors 114 and 118 are coupled to line 108. The outputs of transistors 116 and 120 are also coupled to line 108.

To place prior art circuit 102 into the non-inverting state, the selection signal on line 104 must be set to a logic 0. A logic 0 on line 104 turns off transistors 114 and 118 and turns on transistors 116 and 120. With transistors 114 and 118 off, the input signal on line 106 which is inverted by inverter 110 is not passed as the output signal on line 108. With transistors 116 and 120 on, the input signal on line 106 is passed as the output signal on line 108.

To place prior art circuit 102 into the inverting state so that the output signal is logically equal to the complement of the input signal, the selection signal on line 104 must be set to a logic 1. A logic 1 on line 104 turns on transistors 114 and 118 and turns off transistors 116 and 120. With transistors 114 and 118 on, the input signal on line 106 which is inverted by inverter 110 is passed as the output signal on line 108. With transistors 116 and 120 off, the input signal on line 106 is not passed as the output signal on line 108.

As evident from prior art circuit 102 just described, when prior art circuit 102 is in the non-inverting state, the input signal passes only through transistors 116 and 120. However, when prior art circuit 102 is in the inverting state, the input signal must pass through not only transistors 114 and 118, but also through inverter 110. Inverter 110 introduces a delay which increases the time required to transform the input signal into the output signal. This slowed transformation process reduces the throughput speed of any device in which prior art circuit 102 operates.

Figure 2:
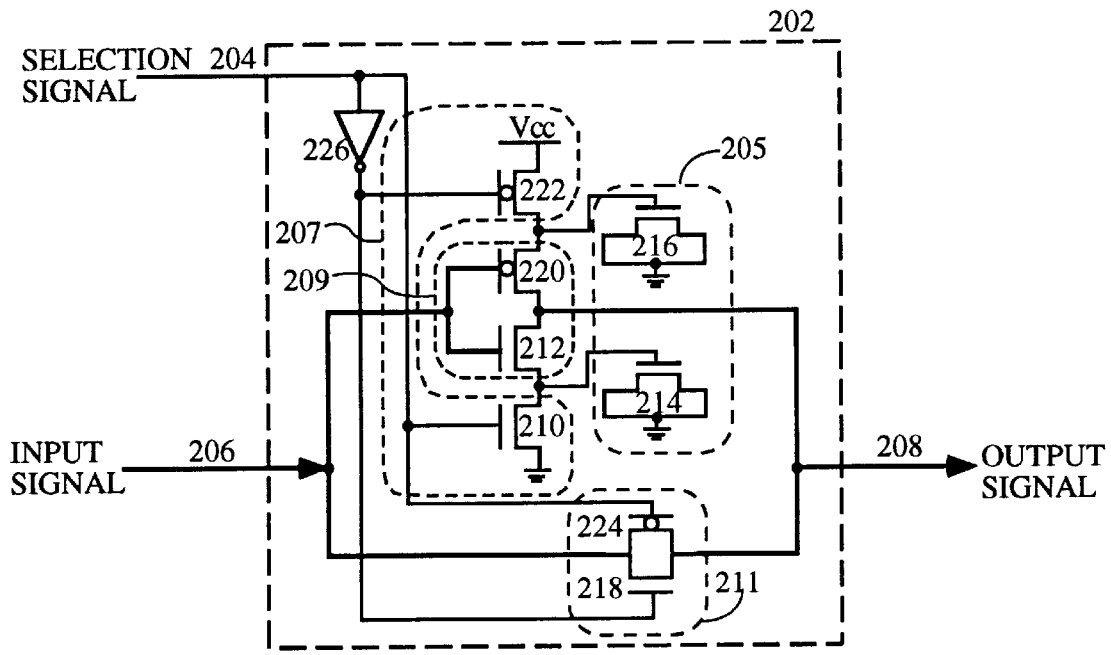
FIG. 2 is a block diagram of a selectable inverter circuit according to the invention.

FIG. 2 is a block diagram of selectable inverter circuit 202 according to the invention. Selectable inverter circuit 202 receives a selection signal on line 204, an input signal on line 206, and generates an output signal on line 208. Selectable inverter circuit 202 sets the output signal equal to the input signal if the selection signal is low. Selectable inverter circuit 202 sets the output signal equal to an inverted input signal if the selection signal is high.

Selectable inverter circuit 202 includes inverter 226, enabling circuit 207, inverter circuit 209, charge storing circuit 205, and pass-through circuit 211. Enabling circuit 207 includes NMOS transistor 210 and PMOS transistor 222. Inverter circuit 209 includes NMOS transistor 212, and PMOS transistor 220. Charge storing circuit 205 includes NMOS transistors 214 and 216 coupled to act as capacitors. The pass-through circuit 211 includes NMOS transistor 218, and PMOS transistor 224.

Line 204 is coupled to the gates of transistors 210 and 224 and through inverter 226 to the gates of transistors 218 and 222. Line 206 is coupled to the gates of transistors 212 and 220 and to the inputs of transistors 218 and 224. The source of transistor 210 is coupled to ground, and the drain of transistor 210 is coupled to the gate of capacitor transistor 214 and to the source of transistor 212. The source to transistor 222 is coupled to power supply voltage 230, and the drain of transistor 222 is coupled to the gate of capacitor transistor 216 and to the source of transistor 220. The outputs of transistors 212, 218, 220 and 224 are coupled to line 208.

To place selectable inverter circuit 202 into the non-inverting state, the selection signal on line 204 must be set to a logic 0. A logic 0 on line 204 turns off transistor 210, turns on transistor 224, and through inverter 226 turns off transistor 222, and turns on transistor 218. With transistors 210 and 222 off, the input signal on line 206 is not inverted by transistors 212 and 220, since line 208 is pulled neither to ground nor to Vcc through transistors 212 and 220. However, with transistors 218 and 224 on, the input signal on line 206 is passed through transistors 218 and 224 as the output signal on line 208.

Since transistors 214 and 216 are configured to behave as capacitors, and a signal path exists from output line 208 to these capacitors even when transistors 210 and 222 are off, transistors 214 and 216 alternately absorb and expel charge onto line 208 that is approximately 180 degrees out of phase with the input signal. As a result, the input signal on line 206 is transformed into an output signal on line 208 at a slightly slower rate than if capacitor transistors 214 and 216 were eliminated. Those skilled in the art will recognize that the capacitance created by transistors 214 and 216 can be altered so as to adjust how much the output signal switching is slowed down. While this slowing down effect is undesirable, transistors 214 and 216 provide benefits that outweigh this effect, as discussed below.

To place selectable inverter circuit 202 into the inverting state, the selection signal on line 204 must be set to a logic 1. A logic 1 on line 204 turns on transistors 210 and 222 and turns off transistors 224 and 218. With transistors 210 and 222 on, transistors 212 and 220 complement the input signal on line 206 and output the complemented signal on line 208, since line 208 is either pulled to ground or pulled to Vcc.

More specifically, when a logic 1 appears on line 206, transistor 212 is turned on, and transistor 220 is turned off. When transistor 212 is turned on, line 208 is pulled to ground (i.e., a logic 0) via transistor 210. When a logic 0 appears on line 206, transistor 212 is turned off, and transistor 220 is turned on. When transistor 220 is turned on, line 208 is pulled to Vcc (i.e., a logic 1) via transistor 222.

The internal resistance of transistors 210 and 222 would slow down the speed with which enabling circuit 207 can transfer power to inverter circuit 209. As a result, charge storing circuit 205 is incorporated into selectable inverter circuit 202. Transistors 214 and 216 behave like capacitors and thus increase the speed with which the input signal is complemented and transmitted as an output signal on line 208. Transistors 214 and 216 accomplish this by releasing and absorbing a supplemental charge to and from inverter circuit 209 during switching. For a short period of time, this supplemental charge provides the inverter circuit with more power than enabling circuit 207 can deliver. This additional power increases the speed with which selectable inverter circuit 202 operates. Transistor 214 discharges its absorbed supplemental charge to ground through transistor 210 when transistor 212 is off and transistor 220 is on. Transistor 216 receives its supplemental charge from Vcc through transistor 222 when transistor 212 is on and transistor 220 is off.

When transistor 212 is on, positive charge is pulled from line 208 by both the path through transistor 210 and the gate of capacitor transistor 214. Since this positive charge is also pulled down by the gate of transistor 214, line 208 reaches ground potential faster than if positive charge was only pulled down through transistor 210. As a result of the additional pull-down by the gate of transistor 214, the input signal on line 206 is complemented and provided as the output signal on line 208 at a faster rate than if transistor 214 was not present. Those skilled in the art will recognize that the capacitance created by transistor 214 can be altered so as to adjust how much the switching is speeded up.

The equivalent switching speed increase for pulling up line 208 is provided by capacitor transistor 216. Those skilled in the art will also recognize that capacitor transistors 214 and 216 could be replaced by other types of capacitors.

Those skilled in the art will recognize that the capacitance of transistors 214 and 216 may be selected based on a trade-off between how much selectable inverter circuit 202 in the non-inverting state should be slowed down and how much selectable inverter circuit 202 in the inverting state should be speeded up. The capacitance of transistors 214 and 216 may be selected such that selectable inverter circuit 202 in the non-inverting state generates the output signal at the same rate as when selectable inverter circuit 202 is in the inverting state.

While the present invention has been described with reference to a preferred embodiment, those skilled in the art will recognize that various modifications may be made. Variations upon and modifications to the preferred embodiment are provided by the present invention, which is limited only by the following claims.

What is claimed is:

1. A selectable inverter circuit, comprising:
an inverter circuit, having an input terminal coupled to receive a first input signal state and a second input signal state, and coupled to an output terminal, for complementing the input signal states and providing the complemented input signal states at the output terminal;
a charge storing circuit, coupled to the inverter circuit, for supplying a first supplemental charge to the inverter circuit in response to the first input signal state and absorbing a second supplemental charge from the inverter circuit in response to the second input signal state; and
an enabling circuit, having a power supply terminal for providing charge and a ground terminal for absorbing charge, coupled to the inverter circuit and the charge storing circuit, and coupled to receive a selection signal, for routing the first supplemental charge from the power supply terminal to the charge storing circuit and routing the second supplemental charge to the ground terminal from the charge storing circuit, in response to the selection signal.

2. The circuit of claim 1, wherein the charge storing circuit is comprised of:
a first charge storing device coupled to the inverter circuit, for providing the first supplemental charge; and
a second charge storing device coupled to the inverter circuit, for absorbing the second supplemental charge.

3. The circuit of claim 2, wherein the charge storing devices are MOS devices configured as capacitors.

4. The circuit of claim 1, wherein the enabling circuit de-couples the power supply terminal and the ground terminal from the charge storing circuit in response to a first state of the selection signal, and couples the power supply terminal and the ground terminal to the charge storing circuit in response to a second state of the selection signal.

5. The circuit of claim 4, further comprising a pass-through circuit, having an input terminal coupled to receive the input signal states and coupled to the output terminal, the pass-through circuit providing the input signal states at the output terminal.

6. The circuit of claim 5, wherein the enabling circuit enables the pass-through circuit in response to the first state of the selection signal, and disables the pass-through circuit in response to the second state of the selection signal.

7. The circuit of claim 5 wherein:

the pass-through circuit introduces a first delay in providing the input signal states at the output terminal;

the inverter circuit introduces a second delay in providing the complemented input signals at the output terminal; and the charge storing devices have capacitances which cause the first delay to be approximately equal to the second delay.

8. The circuit of claim 1, wherein the enabling circuit comprises:

a first transistor having an input, an output, and a gate, the input coupled to the ground, the output coupled to the charge storing circuit and the inverter circuit, and the gate coupled to receive the selection signal, for connecting the ground terminal to the charge storing circuit and the inverter circuit when the selection signal is set to a first state; and a second transistor having an input, an output, and a gate, the input coupled to the power supply terminal, the output coupled to the charge storing circuit and the inverter circuit, and the gate coupled to receive the selection signal, for connecting the power supply terminal to the charge storing circuit and the inverter circuit when the selection signal is set to the first state.

9. The circuit of claim 1 wherein the inverter circuit comprises:

a first transistor having an input, an output, and a gate, the gate coupled to the input terminal, the input coupled to the charge storing circuit, and the output coupled to the output terminal, for providing the first supplemental charge to the output terminal when the input terminal receives a logic 0; and a second transistor having an input, an output, and a gate, the gate coupled to the input terminal, the input coupled to the charge storing circuit, and the output coupled to the output terminal, for absorbing the second supplemental charge from the output terminal when the input terminal receives a logic 1.

10. A selectable inverter circuit, comprising:

means for setting an output signal equal to a complement of a first input signal state;

means for setting the output signal equal to a complement of a second input signal state;

means for supplying a first supplemental charge to the first means for setting in response to the first input signal state;

means for absorbing a second supplemental charge from the second means for setting in response to the second input signal state;

a power supply terminal, for receiving charge;

a ground terminal, for absorbing charge;

means for routing the first supplemental charge from the power supply terminal to the means for supplying, in response to a selection signal; and means for routing the second supplemental charge to the ground terminal from the means for absorbing, in response to the selection signal.

11. The circuit of claim 10, wherein the:

means for supplying is comprised of means for supplying positive charge; and means for absorbing is comprised of means for absorbing positive charge.

12. The circuit of claim 10, wherein the:

means for routing the first supplemental charge de-couples the power supply terminal from the means for supplying in response to a first state of the selection signal;

means for routing the second supplemental charge de-couples the ground terminal from the means for supplying in response to the first state of the selection signal;

means for routing the first supplemental charge couples the power supply terminal from the means for supplying in response to a second state of the selection signal; and means for routing the second supplemental charge couples the ground terminal from the means for supplying in response to the second state of the selection signal.

13. The circuit of claim 12, further comprises:

means for setting the output signal equal to the first input signal state; and means for setting the output signal equal to the second input signal state.

14. The circuit of claim 13 wherein the:

means for setting the output signal equal to the first input signal state, and the means for setting the output signal equal to the second input signal state introduce a first delay;

means for setting an output signal equal to a complement of a first input signal state, and the means for setting the output signal equal to a complement of a second input signal state introduce a second delay; and means for supplying a first supplemental charge and the means for absorbing a second supplemental charge have capacitances such that the first delay is approximately equal to the second delay.

15. The circuit of claim 13, wherein:

the means for setting the output signal equal to the first input signal state, and the means for setting the output signal equal to the second input signal state are enabled in response to the first state of the selection signal; and the means for setting the output signal equal to the first input signal state, and the means for setting the output signal equal to the second input signal state are disabled in response to the second state of the selection signal.

* * * * *